United States Patent [19]
Balakrishna et al.

[11] Patent Number: 5,985,024
[45] Date of Patent: Nov. 16, 1999

[54] METHOD AND APPARATUS FOR GROWING HIGH PURITY SINGLE CRYSTAL SILICON CARBIDE

[75] Inventors: Vijay Balakrishna, Monroeville; R. Noel Thomas, Murrysville; Godfrey Augustine, Pittsburgh; Richard H. Hopkins, Export, all of Pa.; H. McDonald Hobgood, Pittsboro, N.C.

[73] Assignee: Northrop Grumman Corporation, Los Angeles, Calif.

[21] Appl. No.: 08/987,572

[22] Filed: Dec. 11, 1997

[51] Int. Cl.$^6$ ..................................................... C30B 23/00
[52] U.S. Cl. ............................... 117/84; 117/99; 117/104; 117/951
[58] Field of Search ................................. 117/84, 99, 104, 117/951

[56] References Cited

U.S. PATENT DOCUMENTS

Re. 34,861  2/1995  Davis et al. .
5,230,768   7/1993  Furukawa et al. ....................... 117/101

FOREIGN PATENT DOCUMENTS 409268099  10/1997  Japan .............................. C30B 29/36

OTHER PUBLICATIONS

J. D. Parsons et al– Epitaxial Growth of Beta–SiC on $TiC_x$ by Reactive Evaporation– J. Electrochem. Soc. vol. 140 No. 6 Jun. 1993.

O. Kordina et al., "High Temperature Chemical Vapor Deposition of SiC", Applied Physics Letters, 69(10), Sep. 2, 1996 1456–58.

Brander, R.W., "Epitaxial Growth of Silicon Carbide", Journal of the Electrochemical Society, vol. III No. 7 (Jul. 1964): 881–883.

*Primary Examiner*—William Powell
*Assistant Examiner*—Donald L. Champagne

[57] ABSTRACT

Method and apparatus for growing semiconductor grade silicon carbide boules (84). Pure silicon feedstock (36) is melted and vaporized. The vaporized silicon is reacted with a high purity carbon-containing gas (64), such as propane, and the gaseous species resulting from the reaction are deposited on a silicon carbide seed crystal (50), resulting in the growth of monocrystalline silicon carbide.

7 Claims, 3 Drawing Sheets

METHOD AND APPARATUS FOR GROWING HIGH PURITY SINGLE CRYSTAL SILICON CARBIDE

BACKGROUND OF THE INVENTION

1. Field of the Invention

The invention in general relates to the growing of large silicon carbide crystals and more particularly to silicon carbide boules of high purity and high crystal quality for use in semiconductor devices.

2. Description of Related Art

Silicon carbide is being used extensively as a semiconductor material for various electronic applications. Semiconductor devices of silicon carbide have the ability to operate at higher voltages and temperatures than conventional silicon or gallium arsenide devices thus providing for higher power devices with reduced cooling requirements. Electronic applications for silicon carbide semiconductor devices include compact, low cost airborne, ship and ground-based solid state radars, including transmitters and power supplies, aircraft engine and flight controls, electric tank and ship propulsion systems, temperature tolerant power conditioners for aircraft and military vehicles and satellite communications, to name a few. In the commercial sector, silicon carbide may be used in the field of high definition television, industrial power conditioning, personal communication systems, nuclear control and instrumentation and electric vehicle power trains.

Silicon carbide crystals may be grown in a variety of ways, one of which utilizes a furnace system into which is introduced gaseous sources of silicon and carbon. The silicon source is constituted by silane gas, the use of which requires an extensive investment in safety equipment since silane is highly toxic and explosive.

In another process known as physical vapor transport, a seed crystal of silicon carbide is positioned within a furnace system which also includes a source, or feedstock, in the form of silicon carbide powder. The feedstock is heated to a particular temperature, with the seed crystal maintained at a different temperature whereby the silicon carbide sublimes and silicon carbide is deposited upon the seed crystal forming a boule. After the boule is grown to the desired size, it is removed from the furnace system and then prepared and sliced into wafers for use as semiconductor device substrates.

During the growth process, the feedstock becomes depleted and the apparatus may be partially disassembled in order to replenish the silicon carbide powder. This time consuming procedure is repeated until the desired silicon carbide crystal boule length is achieved. The present invention obviates this time consuming operation.

In addition, silicon carbide powder feedstock is not available in an ultra high purity, semiconductor quality grade. Consequently, the grown single crystal silicon carbide typically includes unwanted contaminants, leading to degraded operation. The present invention additionally provides for ultra high purity, semiconductor grade silicon carbide single crystal boule or epitaxial layer growth.

SUMMARY OF THE INVENTION

High purity silicon is melted and vaporized in a physical vapor transport growth furnace into which is placed a seed crystal such as silicon carbide. A high purity carbon containing gas is introduced to react with the vaporized silicon. A certain temperature distribution profile is maintained, preferably by a two part heating system, to promote deposition, on the seed crystal, of silicon carbide formed from the gaseous species resulting from the reaction. For growing large boules the apparatus includes a growth structure having a growth cavity therein to accommodate for elongation of the growing boule.

DESCRIPTION OF THE PREFERRED EMBODIMENTS

Figure 1:
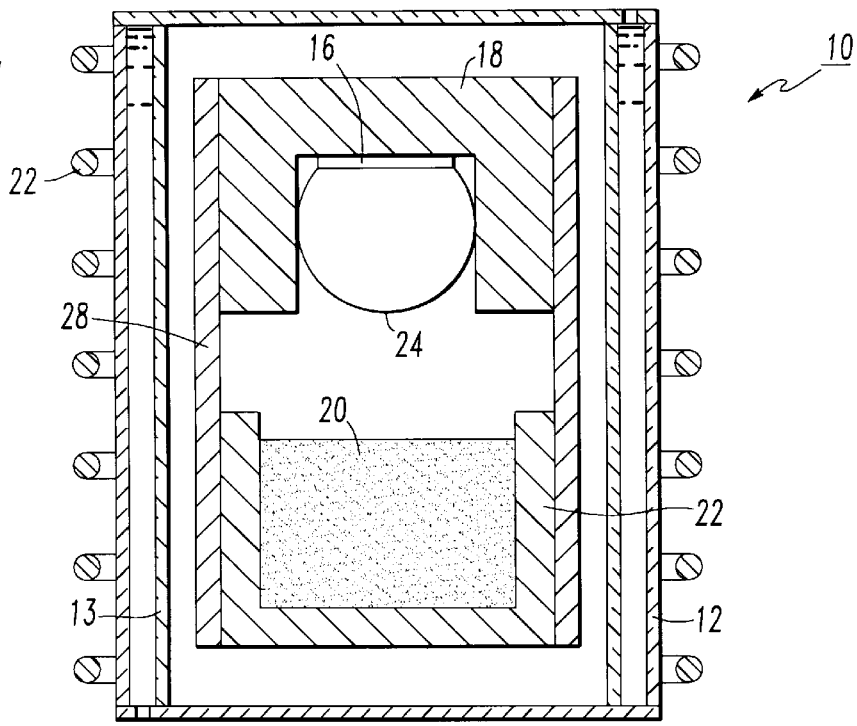
FIG. 1 shows, in rudimentary form, typical apparatus for growing silicon carbide boules by the physical vapor transport process.

In the drawings, which are not necessarily to scale, like or corresponding parts are denoted by like or corresponding reference numerals.

FIG. 1 shows, in rudimentary form, a typical apparatus for growing silicon carbide boules by the aforementioned physical vapor transport method. The apparatus includes a furnace system 10 having a vacuum tight enclosure formed by coaxial quartz cylinders 12 and 13, with a cooling water flow between them. A silicon carbide seed crystal 16 within seed container 18 is disposed at a certain distance from silicon carbide feedstock 20, typically silicon carbide powder, within feedstock container 22. The required temperature for growth of the silicon carbide boule 24 is provided by a heating system such as an RF coil 26, which may be inside or outside of the enclosure formed by cylinders 12 and 13.

To grow the silicon carbide boule 24, the silicon carbide seed crystal 16 and silicon carbide feedstock 20 are placed in position surrounded by thermal insulation 28 and the furnace system is brought down to a near vacuum pressure of, for example, $10^{-7}$ Torr. The heater system is then activated to drive off any adsorbed gases in order to reduce any electrically active impurities which may be present. The interior pressure is then increased to near atmospheric pressure and then reduced to operating pressure where the growth temperature is established.

During the growth process, if a boule in excess of about 5 cm is desired, the feedstock 20 becomes depleted to a point where it must be recharged. The apparatus is shut down, opened, and the feedstock charge is reloaded, after which temperature and pressure conditions are reestablished. This time consuming operation is repeated until the desired boule length is achieved.

The present invention allows for boule growth to extended lengths, without the requirement for repetitive disassembly and feedstock recharging.

In addition, the purity of the silicon carbide powder feedstock is not as high as semiconductor grade material (background impurities of $10^{17}$ cm$^{-3}$ vs $10^{14}$ cm$^{-3}$ required for high quality device fabrication) and very often the grown boule includes imperfections which would degrade proper semiconductor operation.

Figure 2:
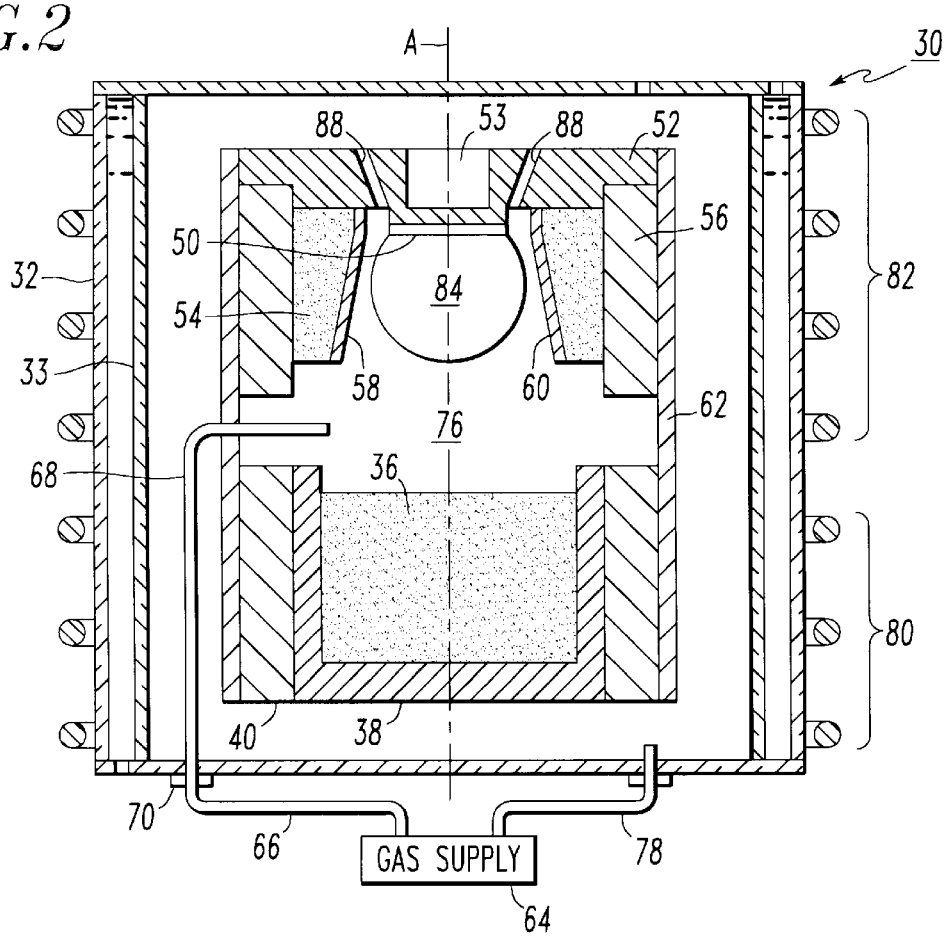
FIG. 2 illustrates one embodiment of the present invention.

FIG. 2 illustrates, by way of example, one embodiment of an improved physical vapor transport apparatus for growing semiconductor grade silicon carbide boules, although it is to be understood that the principles disclosed herein are also applicable to the growth of thin or thick epitaxial layers on a seed of silicon carbide, or other suitable material constituting a substrate member. In a manner similar to the prior art, the apparatus includes a furnace system 30 having a vacuum tight enclosure surrounding longitudinal axis A and formed by coaxial cylinders 32 and 33 with a cooling water flow between them.

Disposed at a first location within the furnace system 30 is a source of semiconductor grade silicon 36 having an ultra high purity in the order of $10^{11}$ to $10^{13}$ $cm^{-3}$. The silicon 36 is contained within a quartz or graphite receptacle 38, surrounded by a graphite susceptor 40. Axially displaced from the silicon 36, at a second location within the furnace system 30 is a seed crystal 50, mounted on a seed holder 52 having a hollow portion 53 directly behind the seed crystal. Although other materials may be applicable, the present invention will be described with respect to a seed crystal of silicon carbide.

A crystal growth structure surrounds the seed crystal 50 and includes a porous graphite wall 54 surrounded by graphite susceptor 56 and defining an interior growth cavity 58. In order to reduce the radial migration of potential impurities into the growth cavity from the wall 54 or susceptor 56, a protective coating 60, of a high purity material such as silicon carbide or tantalum carbide, may be incorporated. A thermal insulation 62 surrounds the components.

The improved apparatus includes a source of high purity carbon-containing gas, either full strength or diluted with an inert gas or active carrier. One example of such carbon-containing gas which may be utilized herein is propane ($C_3H_8$). The propane gas, suitably metered from a gas supply system 64, is provided to the furnace system 30 by means of a conventional gas conduit 66. A high temperature gas conduit 68, connected to conduit 66 by a coupling 70, then delivers the metered propane gas to a reaction zone 76 above the silicon 36. The gas supply 64 is also operable to supply to the furnace interior, via conduit 78, an inert gas such as argon for varying and controlling interior pressure.

A heating system is provided and is comprised of two independent heating arrangements. By way of example, a first heater, in the form of an RF coil 80 is provided to heat the silicon 36 to a predetermined temperature sufficient to melt and vaporize the silicon. A second heater, also in the form of an RF coil 82, is provided to heat the growth cavity 58 to the appropriate temperature for the promotion of crystal growth.

Figure 3:
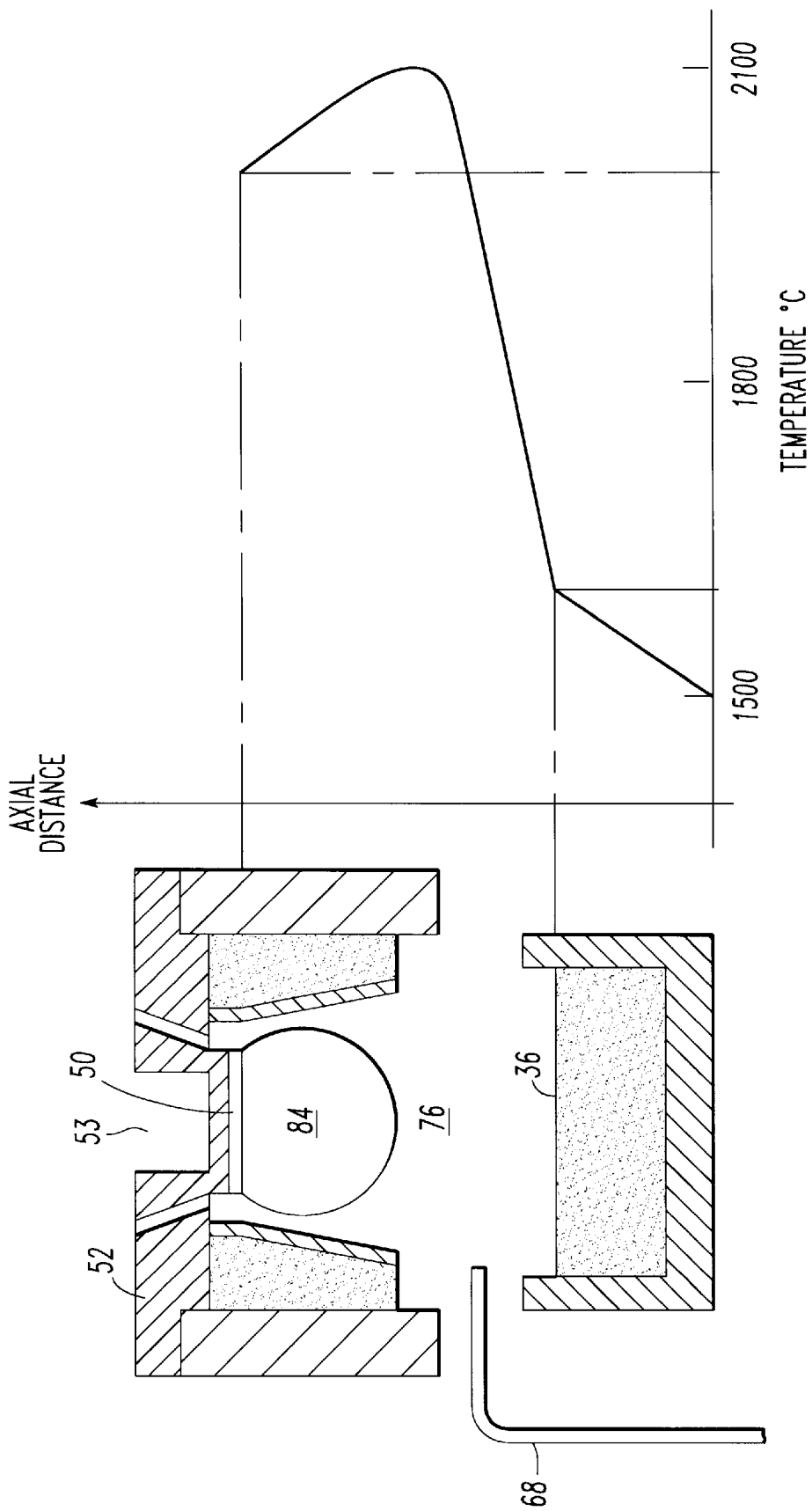
FIG. 3 illustrates the nominal temperature profile existing within the apparatus of FIG. 2.

In operation, after appropriate furnace degassing procedures, the requisite temperatures are established for crystal growth of a silicon carbide boule 84. FIG. 3 duplicates some of the elements of FIG. 2 and additionally illustrates, by way of example, one temperature distribution profile 90 in terms of temperature vs axial distance, for the growth process.

The high purity semiconductor grade silicon 36 may be initially introduced into container, or receptacle 38, in the form of a solid single cylinder of silicon, as a powder or as individual silicon nuggets. Silicon has a melting point of about 1420° C. and accordingly, the temperature at the first location will generally be at least 1500° C. The profile of FIG. 3 illustrates a temperature of about 1600° C. at the first location and being of a value not only to melt the silicon but to also vaporize it and provide for a large flux of silicon atoms, orders of magnitude greater than is possible with the prior art silicon carbide feedstock. The temperatures and temperature profile are adjusted to assure an appropriate flux of silicon and carbon constituents and deposition of silicon carbide on the seed 50.

The propane is introduced into the reaction zone 76 at a temperature sufficient to decompose the gas into hydrocarbon components. In the presence of silicon vapor there is a reaction which forms various gaseous molecular species, the predominant ones of which include, silicon dicarbide ($SiC_2$), disilicon carbide ($Si_2C$) and silicon (Si). The gaseous molecular species condense on the growing crystal boule 84 resulting in the macroscopic growth of monocrystalline silicon carbide, thus elongating the boule in the axial direction until the desired length is achieved. Excess gas which passes around the boule 84 may be removed from the growth cavity 58 by means of passageways 88 in the seed holder 52 or by other appropriate means. Thereafter the gas is removed from the furnace by connection to a vacuum pump (not shown).

The temperature profile 90 illustrates a cooler seed 50 and growth cavity 58 temperature than the reaction zone 76. By way of example, the seed crystal 50 will be greater than 1500° C. and generally at least 1900° C. FIG. 3 illustrates the seed temperature to be around 2000° C. The decrease in temperature between the reaction zone 76 and the seed crystal 50 promotes condensation of the vapor species, and is due to the fact that the hollow portion 53 of the seed holder 52 contributes to the cooling of the seed crystal 50. In addition, the insulation and/or RF coil 82 may also be adjusted to achieve the desired temperature profile.

As previously brought out, in the prior art physical vapor transport apparatus the feedstock is comprised of powdered silicon carbide. This limited charge can only supply so much silicon and carbon before it is used up. At the end of a limited growth run the feedstock container is left with a sintered mass of material consisting primarily of a skeleton of carbon. With the present invention however, virtually all of the silicon feedstock may be melted and vaporized during a single run thus eliminating the time consuming replenishment process required for silicon carbide and allowing for a greater size boule (7.6 to 15.24 cm length with up to a 10.16 cm diameter) for the same volume initial charge as silicon carbide and at growth rates (e.g. 0.5 mm/hr) equal to or greater than conventional physical vapor transport systems.

Figure 4:
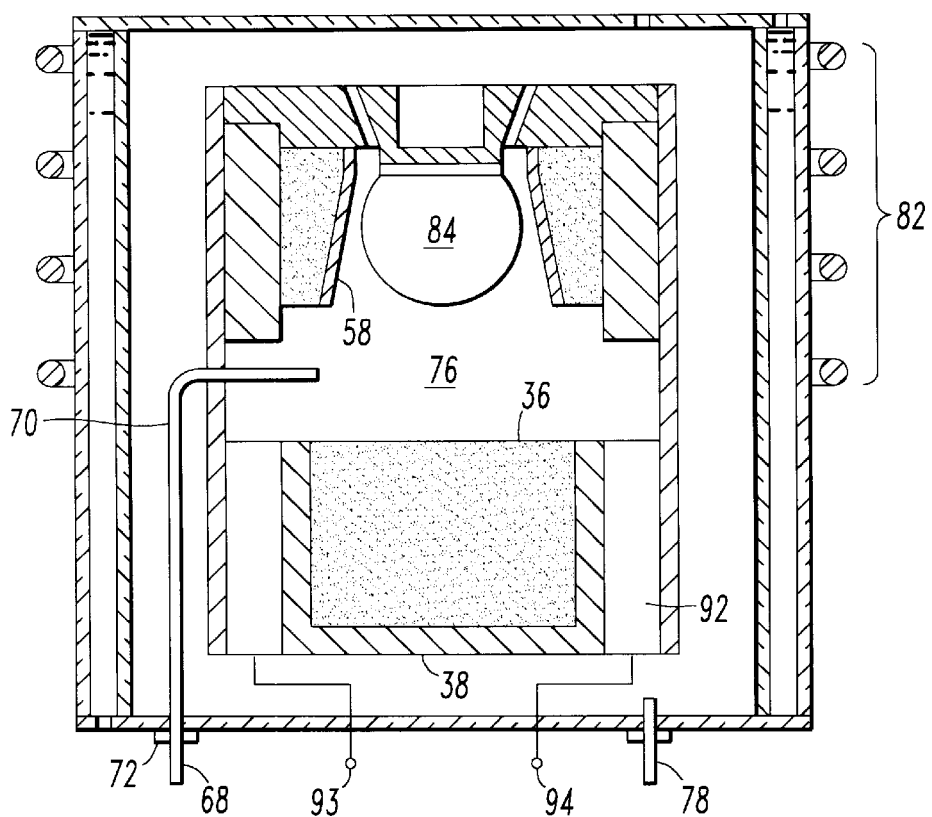
FIG. 4 illustrates another embodiment of the present invention.

FIG. 4 illustrates an embodiment of the invention with an alternative heating system. More particularly, the growth cavity 58 is still heated by RF coil 82, however the receptacle 38 and its silicon contents 36 are heated to the appropriate temperatures by means of a resistance heater 92, such as a graphite resistance heater, which surrounds the receptacle 38 and is supplied with electrical energy at terminals 93, 94. If desired, a similar resistance heater could also be used in place of RF coil 82.

Figure 5:
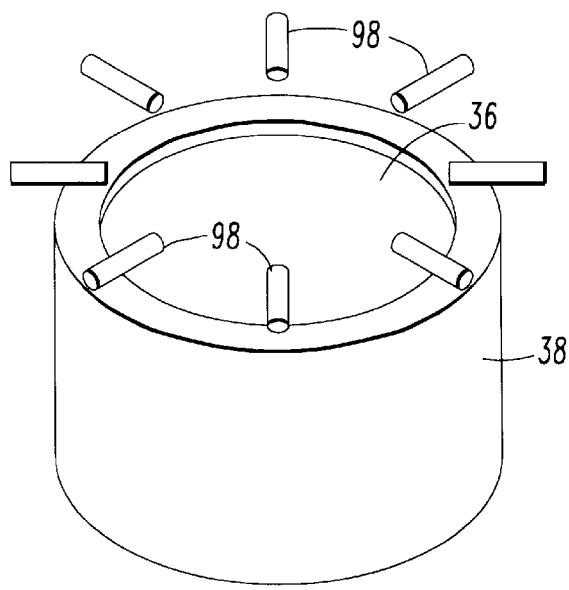
FIG. 5 illustrates an alternative gas supply arrangement.

FIG. 5 illustrates an arrangement for adjusting silicon flux for promotion of a more uniform flux. In this arrangement a plurality (at least two) of high temperature gas conduits are used for supplying the reaction zone with propane gas. In the embodiment of FIG. 5, these conduits 98 are disposed in a 360° array around and above the receptacle 38 and silicon 36, and are positioned to inject the propane gas in a more uniform manner to react with the vaporized silicon. The term conduit as use herein also includes channels which may be provided in the components surrounding the growth cavity and reaction zone. If desired, appropriately designed nozzles may be provide at the ends of the respective conduits 98 to "shape" the actual gas discharge.

Figure 6:
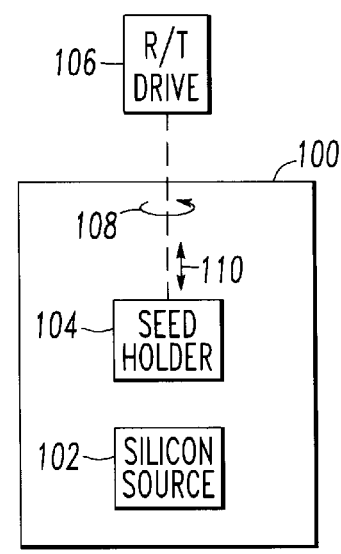
FIG. 6 illustrates an embodiment of the invention wherein a growing silicon carbide crystal may be moved during the growth process.

During the crystal growth process it may be desirable to relatively move the growing crystal. FIG. 6 illustrates a furnace system 100 which includes a silicon source 102 and seed holder 104, as previously described. Drive means in the form of rotational/translational drive 106 is operatively coupled to the seed holder 104 to selectively rotate the seed holder around a longitudinal axis, as indicated by arrow 108, or to move the seed holder 104 along the longitudinal axis, as indicated by arrow 110.

Although the present invention has been described with a certain degree of particularity, it is to be understood that various substitutions and modifications may be made without departing from the spirit and scope of the invention as defined in the appended claims.

What is claimed is:

1. A method of growing a high purity single crystal silicon carbide boule within the interior of a physical vapor transport furnace system comprising the steps of:

(A) placing a seed crystal within said furnace system in a growth structure having a growth cavity therein to accommodate crystal growth along a vertical longitudinal axis, with said growth structure surrounding said vertical longitudinal axis;

(B) placing a high purity silicon feedstock in a receptacle below said growth cavity and in line with said longitudinal axis, defining a reaction zone located between said receptacle and said growth structure;

(C) heating said silicon to a temperature sufficient to melt and vaporize said silicon;

(D) heating said seed crystal to a temperature of at least 2000° C. sufficient to promote crystal boule growth;

(E) introducing a high purity carbon-containing gas into the interior of said furnace system from a source outside of said furnace system to react with said vaporized silicon, in said reaction zone;

(F) maintaining a temperature distribution within said furnace system to cause silicon carbide boule growth along said longitudinal axis by deposition of silicon carbide onto said seed crystal as a result of said reaction of said high purity carbon-containing gas with said vaporized silicon.

2. A method according to claim 1 wherein:

(A) said seed crystal is a silicon carbide seed crystal.

3. A method according to claim 1 wherein:

(A) the gaseous source of carbon is propane gas.

4. A method according to claim 1 wherein:

(A) the step of maintaining a temperature distribution includes maintaining said silicon at a temperature of at least 1500° C.

5. A method according to claim 1 wherein:

(A) the step of maintaining a temperature distribution includes maintaining said reaction zone at a temperature greater than that of said seed crystal.

6. A method according to claim 1 wherein:

(A) said seed crystal is a silicon carbide seed crystal.

7. A method according to claim 1 which includes the step of:

(A) providing a sufficient quantity of said silicon to grow a boule of at least 7.6 cm in length along said longitudinal axis.

* * * * *